(12) United States Patent
Navarro et al.

(10) Patent No.: US 11,923,006 B2
(45) Date of Patent: Mar. 5, 2024

(54) SELECTIVE NON-VOLATILE MEMORY DEVICE AND ASSOCIATED READING METHOD

(71) Applicant: COMMISSARIAT À L'ENERGIE ATOMIQUE ET AUX ÉNERGIES ALTERNATIVES, Paris (FR)

(72) Inventors: Gabriele Navarro, Grenoble (FR); Anthonin Verdy, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 128 days.

(21) Appl. No.: 17/774,017

(22) PCT Filed: Nov. 2, 2020

(86) PCT No.: PCT/EP2020/080673
§ 371 (c)(1),
(2) Date: May 3, 2022

(87) PCT Pub. No.: WO2021/089478
PCT Pub. Date: May 14, 2021

(65) Prior Publication Data
US 2022/0366981 A1 Nov. 17, 2022

(30) Foreign Application Priority Data
Nov. 4, 2019 (FR) ..................................... 1912328

(51) Int. Cl.
*G11C 13/00* (2006.01)
(52) U.S. Cl.
CPC ...... *G11C 13/0069* (2013.01); *G11C 13/0038* (2013.01); *G11C 13/004* (2013.01)

(58) Field of Classification Search
CPC ............................ G11C 13/00; G11C 13/0069
USPC ......................................................... 365/148
See application file for complete search history.

(56) References Cited

U.S. PATENT DOCUMENTS

| 2004/0257848 A1 | 12/2004 | Chen et al. | |
|---|---|---|---|
| 2018/0026077 A1* | 1/2018 | Wu | H10N 70/063 257/4 |
| 2019/0252609 A1* | 8/2019 | Sei | H10N 70/231 |

FOREIGN PATENT DOCUMENTS

WO     WO 03/079463 A2    9/2003

OTHER PUBLICATIONS

Kriverdy,A.,e tal., "Tunable Performances in OTS Selectors Thanks to Ge3Se7—AS2Tes," 2019 IEEE 11'International Memory Workshop,May 2019, XP033563780,pp. 1-4.*
Chen, Y.-C.et al., "An Access-Transistor-Free (OT/1R) Non-Volatile Resistance Random Access Memory (RRAM) Using a Novel Threshold Switching, Self-Rectifying Chalcogenide Device," IEDM, (2003),4pages.*

(Continued)

*Primary Examiner* — Muna A Techane
(74) *Attorney, Agent, or Firm* — Pillsbury Winthrop Shaw Pittman LLP (57) ABSTRACT

A selective non-volatile memory device includes a first electrode, a second electrode and at least one layer made of an active material. The device has at least two programmable memory states associated with two voltage thresholds and also provides a selective role when it is in a highly resistive state.

10 Claims, 5 Drawing Sheets

(56) References Cited

OTHER PUBLICATIONS

International Search Report as issued in International Patent Application No. PCT/EP2020/080673, dated Feb. 1, 2021.
Verdy, A., et al., "Tunable Performances in OTS Selectors Thanks to $Ge_3Se_7$—$As_2Te_3$," 2019 IEEE 11$^{th}$ International Memory Workshop, May 2019, XP033563780, pp. 1-4.
Chen, Y.-C. et al., "An Access-Transistor-Free (0T/1R) Non-Volatile Resistance Random Access Memory (RRAM) Using a Novel Threshold Switching, Self-Rectifying Chalcogenide Device," IEDM, (2003), 4 pages.

* cited by examiner

SELECTIVE NON-VOLATILE MEMORY DEVICE AND ASSOCIATED READING METHOD

CROSS-REFERENCE TO RELATED APPLICATIONS

This application is the U.S. National Stage of PCT/EP2020/080673, filed Nov. 2, 2020, which in turn claims priority to French patent application number 1912328 filed Nov. 4, 2019. The content of these applications are incorporated herein by reference in their entirety.

TECHNICAL FIELD OF THE INVENTION

The technical field of the invention is that of non-volatile memories. The present invention relates to a device integrating both a non-volatile memory function and a selective function. The present invention also relates to the reading method of the device.

BACKGROUND OF THE INVENTION

For applications that require a storage of information even when the voltage is cut off, non-volatile memories of the EEPROM or FLASH type that carry out a storage of charges on floating gates of field-effect transistors, are conventionally used. These memories however have disadvantages:
  long writing time (a few microseconds),
  limited density because the reduction in the size of the transistors leads to a decrease in the reading signal, i.e. a drop in the difference between the two states of the memory point, and a reduction in the retention duration of the information,
  limited number of write cycles because the retention of the information decreases as the write cycles occur due to the creation of defects in the gate oxide of the transistors, allowing the electrons to escape from the floating gate.

Thus, this type of memory does not have the characteristics required to support the development of new technologies such as the SCM memories (for "Storage Class Memory") which have seen significant growth in particular thanks to their capacity to increase the performance of computers while still reducing their consumption.

More recently, other types of rewritable non-volatile memories have appeared, based on active materials such as phase change materials (PCRAM memories or "Phase Change RAM" also called PCM "Phase Change Memory"), with ionic conduction (CBRAM memories or "Conductive Bridging RAM"), with metal oxides (OxRAM memories or "Oxide Resistive RAM"), ferroelectric (FERAM memories or "Ferroelectric RAM"), magnetic (MRAM memories or "Magnetic RAM), or magnetic with spin transfer (STTRAM memories or "Spin Torque Transfer RAM"). These memories are of the resistive type (i.e. they can have at least two states "OFF" or "ON" corresponding to the switching from a resistive state ("OFF" state) to a less resistive state ("ON" state)).

Resistive memories need two electrodes to operate. In the case of PCRAM memories, chalcogenide materials are used which are known for the substantial contrast in electrical resistance that exists between their amorphous (resistive) phase and their crystalline (conductive) phase. This phenomenon is at the basis of PCRAM phase change memories wherein the change in phase is induced by the joule effect thanks to an electric pulse of which the shape makes it possible to reach specific temperature profiles inside the memory. Thus, PCRAM memories comprise an active zone based on a chalcogenide material. The operation of PCRAM memories is based on the phase transition of the chalcogenide material, induced by the heating of this material under the effect of specific electric pulses generated by its two electrodes. This transition is done between the crystalline phase, which is ordered, of low resistance and thermodynamically stable and the amorphous phase, which is disordered, of high resistance and thermodynamically unstable.

In this context, the PCRAM resistive memories that are based on the most mature non-volatile resistive memory technology represent very good candidates for supporting the development of SCM memories.

Recently, substantial attention has been given to the possibility of having systems with an integration of the 3D type, by integrating several layers of memories, stacked on one another, and making it possible to increase the memory density for the same chip surface. This 3D integration is based on the use of integration of the "crossbar" type (also designated by the terminology "crosspoint"). PCRAM resistive memories have in particular the interest of being able to be integrated with high densities, via an integration of the "crossbar" type.

Figure 1:
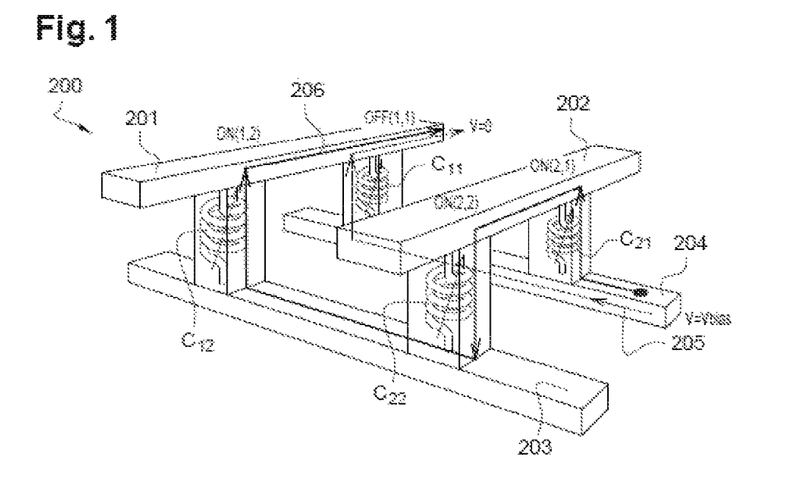
FIG. 1 shows a first addressing architecture of a plurality of memory cells according to the prior art.

Such an architecture 200 is shown in FIG. 1 and comprises a plurality of access lines 201, 202, 203 and 204 and a plurality of memory cells (here four cells C11, C21, C22 and C12) of the non-volatile rewritable PCRAM type. The access lines are formed by top parallel bit lines 201 and 202 and bottom word lines 203 and 204 perpendicular to the bit lines, the elementary cells C11, C21, C22 and C12 being sandwiched at the intersection between the bit lines 201 and 202 and the word lines 203 and 204. The architecture 200 thus forms a network where each memory cell can be addressed individually, by selecting the correct bit line and the correct word line.

This type of architecture does however have certain disadvantages. Thus, the reading phase of the state of a cell is carried out by polarisation of the desired line and of the desired column; it is then possible to observe a parasitic leakage current passing through the adjacent cells. We assume here that:
  The cell C11 is in the OFF state (high resistance state);
  The cell C21 is in the ON state (low resistance state);
  The cell C22 is in the ON state (low resistance state);
  The cell C12 is in the ON state (low resistance state).

Reading the resistive state of the cell C11 involves respectively polarising the bit line 201 and the word line 204 (application of a potential difference Vbias between these two lines). In theory, the measuring current should flow only according to the arrow 205 shown as a dotted line. In practice, due to the fact that the three other cells are in the ON state, a parasitic leakage current, represented by the arrow 206 ("sneak pass"), passes through the non-resistive cells C21, C22 and C12. This leakage current, in particular in the unfavourable case where the adjacent elements of the cell to be measured are in the ON state, can disturb the measurement until preventing the discrimination between the ON state and the OFF state of the cell to be measured.

Figure 2:
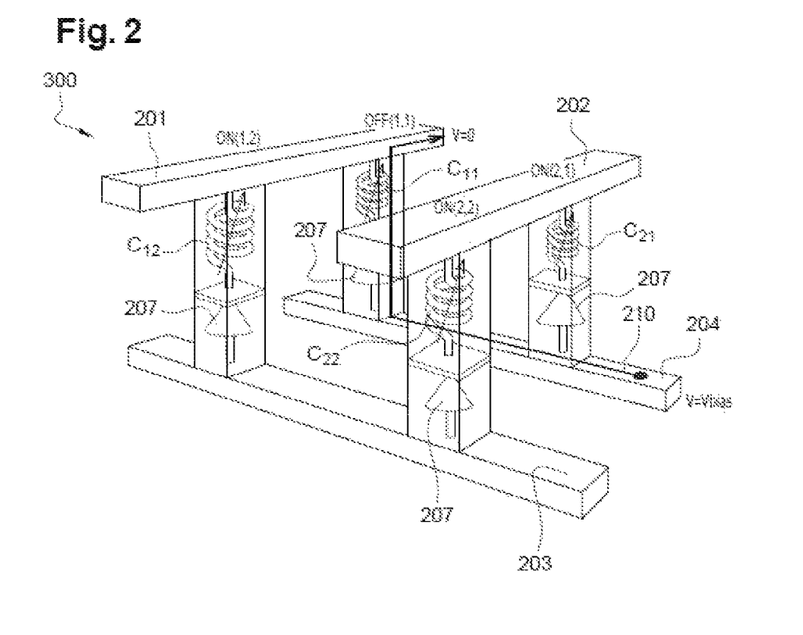
FIG. 2 shows a second addressing architecture of a plurality of memory cells according to the prior art.

A known solution to this problem consists of adding, in series with each one of the cells, a p/n junction diode (for example with a Si base) 207 to play the role of a selector. Behaviour of the "diode" type is defined as that of a device based on two access terminals, with a very low conductivity above a voltage of voltage $V_{th}$ and high conductivity when the voltage $V_{th}$ is exceeded. Each memory cell is referred to as 1R and each selector is referred to as 1S. This is thus referred to as memory point 1R/1S. Such an architecture 300 is shown in FIG. 2. Common elements bear the same reference numbers in FIGS. 1 and 2, with the understanding that the cells C11, C21, C22 and C12 of FIG. 2 are in the same resistive state as the cells C11, C21, C22 and C12 of FIG. 1. In this case, as the diodes 207 are unipolar, they block the passing of the parasitic current, thus authorising only the current represented by the arrow 210 induced by the polarisation of the bit line 201 and the word line 204 (application of a potential difference Vbias between these two lines).

The architecture such as shown in FIG. 2 however also gives rise to certain difficulties linked in particular to the fact that standard diodes with a Si base are not the most relevant solution because they are difficult to manufacture, they have excessive series resistances and a low current density in the "active" state which is incompatible with the programming of a resistive memory. Thus, the diodes have current intensities in ON mode that remain limited. Thus, currently, for a given silicon surface, it is not possible to create a diode of the same surface as the memory cell and having a sufficient pass-through current $I_{ON}$ (current density of the diodes is too low) and at the same time a rather low leakage current $I_{OFF}$. Such a situation in particular gives rise to serious difficulties in the case of the use of a diode in series with a cell of the PCRAM phase change type which requires substantial switching currents.

That is why several alternative solutions have been studies in the last few years. In literature, different types of selectors can be found such as FAST (for "Field Assisted Superlinear Threshold"), MIEC (for "Mixed-Ionic-Electronic Conduction") and OTS (for "Ovonic Threshold Switching").

Figure 3:
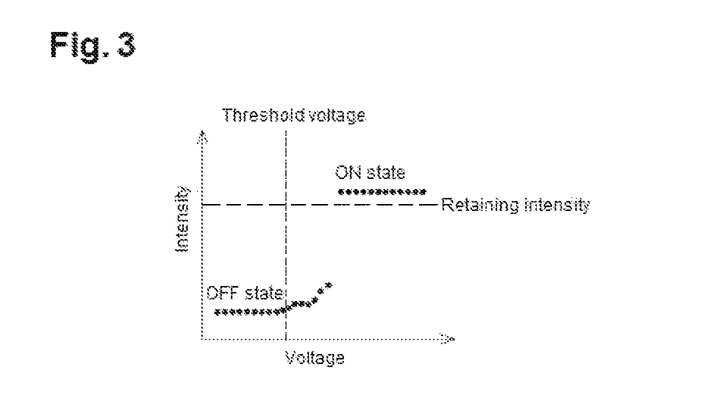
FIG. 3 shows a graph that explains the operating principle of a selective device.

A selective device is comprised of two electrodes and an active material, with the electrodes being disposed on either side of the active material and making it possible to apply a voltage to this active material. In the case of a selector of the OTS type, the active material can be a chalcogenide alloy. The basic principle of the operation of a selective device is shown in FIG. 3. The device is very resistive in the OFF state. As soon as a voltage greater than a threshold voltage is applied to it, the current rapidly increases to reach the ON state of the device, a low resistive state. As soon as the current or the voltage is reduced below a specific value referred to as the "retaining" or "holding" value, the device becomes OFF again. The first function of a selective device is therefore to block the passage of low voltage" current (sub-threshold) and to allow the passage of a strong current density, once the threshold voltage $V_{th}$ is reached.

Today, the main problem of a crossbar structure is to find a good compromise in terms of electrical performance between the memory 1R and the selector 1S. In order to be able to be integrated with a resistive memory 1R, a selector 1S has to have several constraining specificities. Indeed, it has to have a size that is close to that of the memory and a low leakage current $I_{OFF}$ when the selector is in its "OFF" state while still being compatible with the memorisation properties of the memory 1R.

In order to further improve the integration density of resistive memories, a conventional solution is to reduce the size of the surface between the active material of the resistive memory and its bottom electrode in order to allow for a reduction in the programming current of the resistive memory.

According to another approach of the memorisation, the article "an Access-Transistor-Free (0T/1R) Non-Volatile Resistance Random Access Memory (RRAM) Using a Novel Threshold Switching, Self-Rectifying Chalcogenide Device" (Yi-Chou Chen et al., IEDM 2003) describes the possibility in a device integrating an active layer made of chalcogenide ($Ge_2Sb_2Te_5$ is very widely used to create PCRAM memories) to have different amorphous volumes, with different resistances (i.e. if the volume of the amorphous volume is reduced, the resistance of the programmed state is reduced) but especially different threshold voltages $V_{th}$ according to programming pulse parameters used. In this article, it is proposed to use this electrical property to store the information in the parameter formed by the threshold voltage $V_{th}$, by programming it thanks to controlling the amorphous volume, obtained by different intensities of electric pulses. This property is also described in patent application US2004/0257848A1 which describes the possibility of using a phase change memory only in its amorphous phase, by modulating the threshold voltage by a control of the intensity and of the duration of the electrical pulse.

The devices described in the article "an Access-Transistor-Free (0T/1R) Non-Volatile Resistance Random Access Memory (RRAM) Using a Novel Threshold Switching, Self-Rectifying Chalcogenide Device" also however have a sub-threshold current that is much too high, of about $10^{-6}$ A, to be used without a selector in a crossbar array. Furthermore, it is observed that the programming of these memories is not yet well controlled and that the programming pulse durations have to be very short in order to prevent any crystallisation of the material.

SUMMARY OF THE INVENTION

The invention offers a solution to the problems mentioned hereinabove, by proposing a non-volatile memory device that is adapted to be integrated into a device with an architecture of the "crossbar" type and that makes it possible to overcome the usage constraints of a resistive memory in series with a selector.

A first aspect of the invention relates to a selective non-volatile memory device comprising:
  a first electrode;
  a second electrode;
  at least one layer made of an active material, referred to as active memory layer, disposed between the first and the second electrode;
said device having at least two programmable memory states:
  a first programmable non-volatile memory state associated with a first threshold voltage $V_{th1}$ for the active layer, said device having in said first memory state a characteristic voltage current such that it switches from a highly resistive state to a state that is less resistive than the highly resistive state as soon as a voltage greater than or equal to $V_{th1}$ is applied between the first and second electrodes and returns to its highly resistive state when the voltage applied is strictly less than $V_{th1}$, the intensity of the current passing through said memory in its highly resistive state being strictly less than $10^{-7}$ A;
  a second non-volatile memory state associated with a second threshold voltage $V_{th2}$ strictly greater than the first threshold voltage $V_{th1}$, said device having in said second memory state a characteristic voltage current such that it switches from a highly resistive state to a state that is less resistive than the highly resistive state as soon as a voltage greater than or equal to $V_{th2}$ is applied between the first and second electrodes and returns to its highly resistive state when the voltage applied is strictly less than $V_{th2}$, the intensity of the current passing through said memory in its highly resistive state being strictly less than $10^{-7}$ A.

According to the invention, the material of the active layer is made of a mixture of an $As_2Te_3$ alloy and of a $Ge_3Se_7$ alloy.

Thanks to the invention, a device is proposed that integrates both a non-volatile rewritable memory function and a selective function. The non-volatile memory function is provided by the use of a programmable threshold voltage that can have at least two values $V_{th1}$ and $V_{th2}$: the memory state is given by the value of this programmed threshold voltage in the device. In other terms, contrary to PCRAM memories, the non-volatile memory device according to the invention is not a resistive memory since the memory state does not depend on the resistive state of the device. The "selective" function is provided by a sub-threshold current (i.e. the current passing through the device when the latter is respectively subjected to a voltage strictly less than $V_{th1}$ or $V_{th2}$ according to whether it is in the memory state $V_{th1}$ or $V_{th2}$) strictly less than $10^{-7}$ A: such values of sub-threshold current are comparable to those provided by the known selectors. Note that the selective function is volatile in such a way that as soon as the voltage at the terminals of the device pass respectively under $V_{th1}$ or $V_{th2}$ according to whether it is in the memory state $V_{th1}$ or $V_{th2}$, the device becomes highly resistive with a current of intensity strictly less than $10^{-7}$ A.

Thus, the device according to a first aspect of the invention can be seen as a selective device with a non-volatile threshold switching (or "NVTS"). The material chosen is a chalcogenide material (i.e. a chemical compound containing at least one chalcogenide element such as oxygen, sulphur, selenium, tellurium or polonium) obtained by the combination of the As2Te3 and Ge3Se7 alloys where the As2Te3 leads to behaviour of the "switch" type and the Ge3Se7 the increase in the gap of the system which makes it possible to reduce the leakage currents.

The chalcogenide material will be chosen to have a very high resistivity in its amorphous stationary state (OFF state) and strong conductivity once subjected to a voltage greater than its threshold voltage, such as the so-called "OTS" materials, but with the particularity of having a modulation of the threshold voltage possible.

Thus, this material is advantageously chosen to not have any crystallisation during the operation thereof. Thanks to the choice of the ad hoc material it is thus possible to:
Guarantee a very substantial sub-threshold resistance in order to reduce the leakage current in arrays of the crossbar type;
Have a programmable threshold voltage that depends on the shape of the pulse applied (in particular according to the descending flank of the pulse).

Note that according to this first aspect of the invention, the first non-volatile memory state corresponding to the threshold voltage state $V_{th1}$ can be programmed by applying a voltage pulse greater than $V_{th2}$ with a predetermined descending flank of a predetermined non-zero duration and greater than the duration of the descending flank of the programming voltage pulse of the second memory state. The behaviour of the change in the voltage threshold of the material according to the duration of the descending flank of the programming pulse will thus advantageously be used. It is interesting to observe that those skilled in the art would not naturally go towards such a solution when reading patent application US 2004/0257848 A1 wherein it is clearly indicated therein, that the use of a pulse with a substantial descending flank could trigger the crystallisation of the material, and therefore a loss in the operation. No difference is made as to the use of different durations of descending flanks for the two programming states. Furthermore, the descending flanks described in this patent application are all less than 50 ns, in particular to prevent crystallisation. Such a phase change would involve a possible partial or total loss of the information due to different factors such as the temperature or the parasitic effects of the control circuitry.

Finally, it is interesting to observe that the programming of the highest threshold voltage in this patent application is obtained by applying a given programming current and of a voltage pulse greater than said highest voltage threshold (which goes against the device according to a first aspect of the invention where the programming of the highest threshold voltage Vth2 is obtained by applying a voltage pulse comprised between $V_{th1}$ and $V_{th2}$, and therefore less than $V_{th2}$).

In addition to the characteristics that have just been mentioned in the preceding paragraph, the device according to an aspect of the invention can have one or more additional characteristics among the following, taken individually or according to any technically permissible combination:
the mixture comprises a percentage greater than 15% and strictly less than 60% by weight of the $As_2Te_3$ alloy.
the mixture comprises a percentage substantially equal to 20% by weight of the $As_2Te_3$ alloy.
the thickness of the active layer is chosen according to the difference desired between the first threshold voltage $V_{th1}$ and the second threshold voltage $V_{th2}$.
the active layer is constituted by a single active layer made of a mixture of an $As_2Te_3$ alloy and of a $Ge_3Se_7$ alloy.
the active layer is constituted by a stack of layers wherein each layer has a thickness less than or equal to 5 nm. These layers together form a stack comprised of a mixture of an $As_2Te_3$ alloy and of a $Ge_3Se_7$ alloy intended to form the active layer.

A second aspect of the invention relates to a method for writing the second memory state in a device according to the invention, said second non-volatile memory state being programmed by applying a given programming current and a current pulse comprised between $V_{th1}$ and $V_{th2}$ with a descending flank of a predetermined duration.

A third aspect of the invention relates to a method for writing the first memory state in a device according to the invention, the first non-volatile memory state being programmed by applying a voltage pulse greater than $V_{th2}$ with a predetermined descending flank of a predetermined non-zero duration and greater than the duration of the descending flank of the programming voltage pulse of the second memory state written by the method according to a second aspect of the invention.

Advantageously, the descending flank of a predetermined non-zero duration of the voltage pulse greater than $V_{th2}$ has a slope preferably comprised between $10^6$ V/s and $10^8$ V/s A fourth aspect of the invention relates to a method for reading the memory state of the device according to the invention comprising a step of applying a voltage pulse strictly greater than $V_{th1}$ and strictly less than $V_{th2}$ with a predetermined descending flank of a predetermined non-zero duration and greater than the duration of the descending flank of the programming voltage pulse of the second memory state written by the method for writing according to a second aspect of the invention.

The invention and its different applications shall be better understood when reading the following description and when examining the accompanying figures.

BRIEF DESCRIPTION OF THE FIGURES

The figures are shown for the purposes of information and in no way limit the invention.

DETAILED DESCRIPTION OF AN EMBODIMENT OF THE INVENTION

Unless mentioned otherwise, the same element that appears on different figures has a unique reference.

[FIG. 1] has already been described in reference to the prior art.

[FIG. 2] has already been described in reference to the prior art.

[FIG. 3] has already been described in reference to the prior art.

Figure 4:
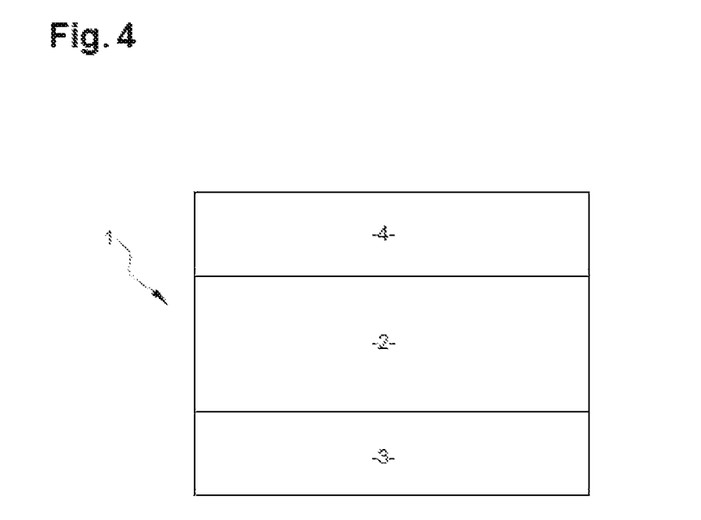
FIG. 4 shows a diagrammatical representation of a device according to a first aspect of the invention.

[FIG. 4] shows a diagrammatical representation of a device 1 according to a first aspect of the invention.

Figure 5:
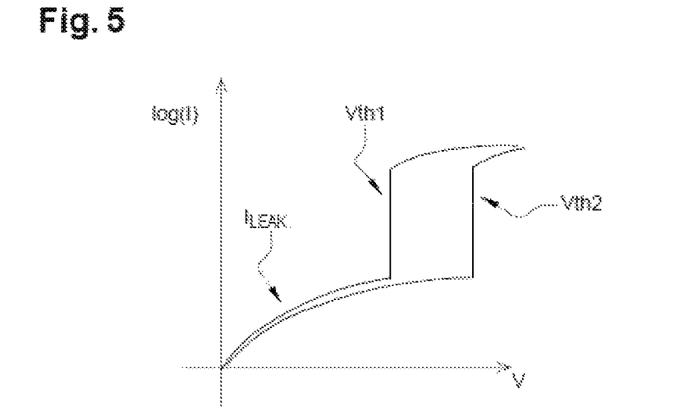
FIG. 5 shows the change in the current on a logarithmic scale passing through the device of FIG. 4 according to the voltage applied between its bottom and top electrodes.

[FIG. 5] shows the change in the current on a logarithmic scale passing through the device of FIG. 4 according to the voltage applied between its bottom and top electrodes.

Figure 6:
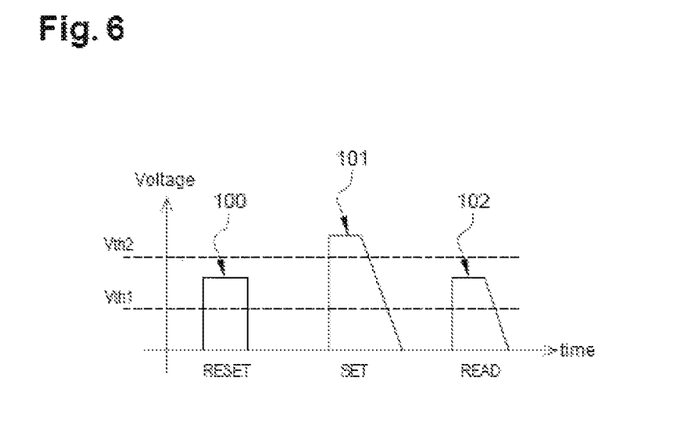
FIG. 6 diagrammatically shows examples of programming and reading pulses making it possible to use the device of FIG. 4 as memory.

[FIG. 6] diagrammatically shows examples of programming and reading pulses making it possible to use the device of FIG. 4 as memory.

Figure 7:
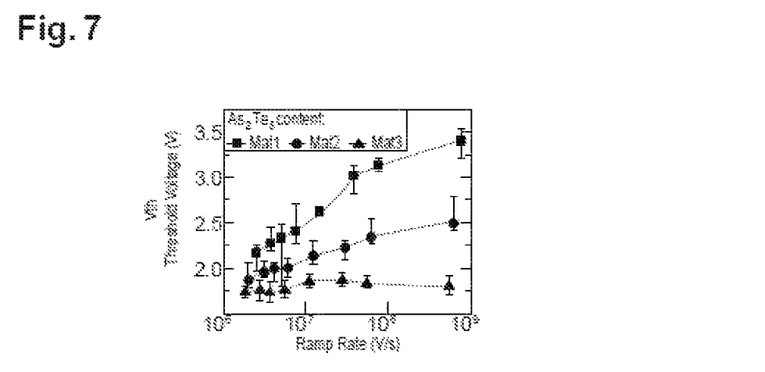
FIG. 7 shows the behaviour of the threshold voltage according to the slope of the descending flank of the programming pulse for three materials of the active layer of the device of FIG. 4.

[FIG. 7] shows the behaviour of the voltage threshold according to the slope of the descending flank of the programming pulse for three materials of the active layer of the device of FIG. 4.

Figure 8:
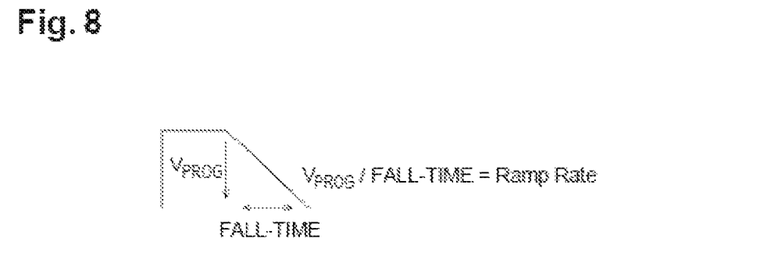
FIG. 8 shows the behaviour of the sub-threshold current according to the slope of the descending flank of the programming pulse for three materials of the active layer of the device of FIG. 4.

[FIG. 8] shows the behaviour of the sub-threshold current according to the slope of the descending flank of the programming pulse for three materials of the active layer of the device of FIG. 4.

Figure 9:
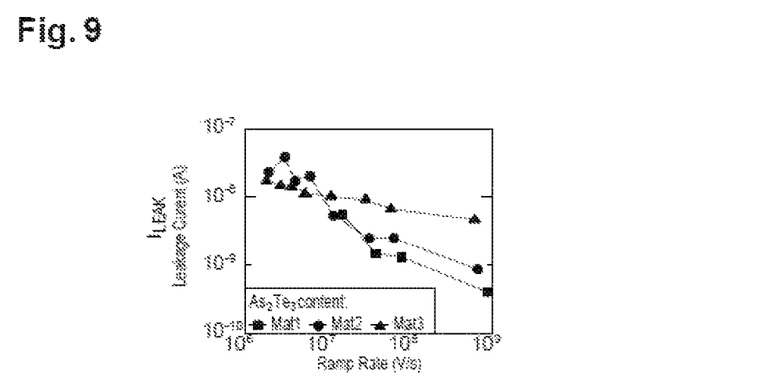
FIG. 9 shows the slope of the descending flank "Ramp rate" of a programming pulse of the device of FIG. 4.

[FIG. 9] shows the slope of the descending flank "Ramp rate" of a programming pulse of the device of FIG. 4.

Figure 10:
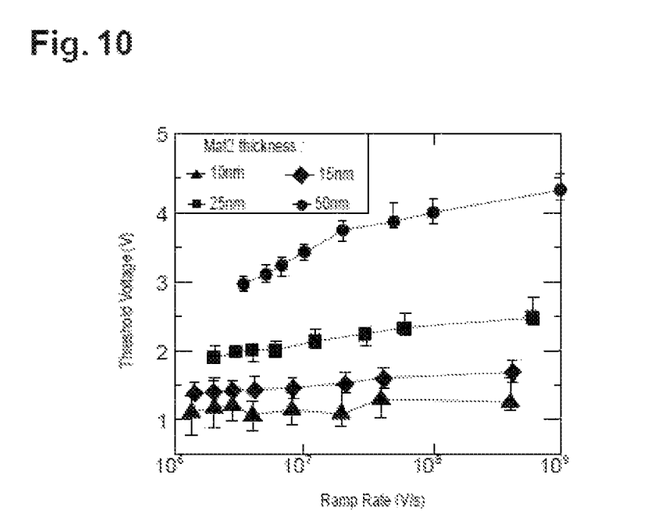
FIG. 10 shows the change in the voltage threshold for an example of material of the active layer of the device of FIG. 4 according to the voltage threshold for four different thicknesses of the active layer.

[FIG. 10] shows the change in the voltage threshold for an example of material of the active layer of the device of FIG. 4 according to the voltage threshold for four different thicknesses of the active layer

Figure 11:
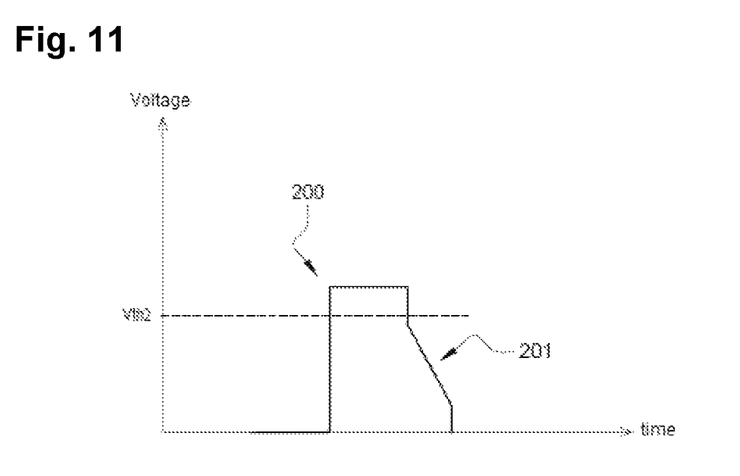
FIG. 11 shows another example of a programming pulse.

[FIG. 11] shows another example of a programming pulse.

As shall be seen in what follows, the device 1 is a device that serves as a non-volatile memory and selector, with the two functions being integrated into the same device 1 which comprises:
- a first electrode or bottom electrode 3;
- a second electrode or top electrode 4;
- a layer 2 made of an active material, referred to as active memory layer, disposed between the first and the second electrode.

A top electrode of a device is defined as the electrode located above this device and the bottom electrode of a device as the electrode located under this device, the electrodes being located on either side of the device. Of course, the adjectives "top" and "bottom" are here relative to the orientation of the assembly including the top electrode, the device and the bottom electrode to the extent that when turning over this assembly, the electrode previously qualified as top becomes the bottom electrode and the electrode previously qualified as bottom becomes the top electrode. Likewise, a vertical disposition of the electrodes can also be provided with the active layer 2 disposed between the two electrodes 3 and 4.

The bottom 3 and top 4 electrodes are each carried out a conductive material that can be different or the same for the two electrodes 3 and 4. Such a conductive material is for example TiN, TaN, W, TiWN, TiSiN or WN.

The active layer 2 is for example a layer of active material of the chalcogenide type carried out by mixing (by co-sputtering for example) from $As_2Te_3$ and $Ge_3Se_7$ alloys. Advantageously, the mixture forming the active material comprises a percentage greater than 15% and strictly less than 60% by weight of $As_2Te_3$. As a preferred example, the mixture forming the active material here comprises 20% by weight of $As_2Te_3$. The principle of co-sputtering is to use the energy of a plasma on the surface of one or more sputtering targets (here $As_2Te_3$ and $Ge_3Se_7$ targets), to pull off one-by-one the atoms of the material of the target or targets and deposit them, for example on the bottom electrode 3.

The material of the active layer 2 is chosen to allow the device 1 to have a very strong resistivity in its amorphous stationary state (so-called "OFF" state) and a strong conductivity once subjected to a voltage greater than a threshold voltage. The particularity of the material chosen is to allow for a modulation of this threshold voltage that can have several values (at least two threshold voltages $V_{th1}$ and $V_{th2}$) thanks to the control of the descending flank of the electrical programming pulse which shall be further covered in what follows. The presence of these two threshold voltages $V_{th1}$ and $V_{th2}$ (with the understanding that it is entirely possible to consider more than two threshold voltages with an ad hoc programming) is shown in FIG. 5 which shows the change in current (on a logarithmic scale) passing through the device 1 according to the voltage applied between the bottom 3 and top 4 electrodes, for the two threshold voltages $V_{th1}$ and $V_{th2}$ obtained by programming the device 1. Note that, in the embodiment described here, the second threshold voltage $V_{th2}$ is strictly greater than the first threshold voltage $V_{th1}$.

Thus, when the device 1 has a threshold voltage Vth1, the intensity of the current passing through it (designated by $I_{Leak}$ or sub-threshold current) is very low (the device is therefore very resistive) as long as the voltage at the terminals of the device 1 is strictly less than $V_{th1}$. As soon as the threshold voltage Vth1 is reached, the current rapidly increases and the device 1 becomes very conductive. As soon as the voltage is reduced again under $V_{th1}$, the device 1 becomes a low conductor again. Note that the material of the active layer is here chosen so that the sub-threshold current has a particularly low intensity; in other terms, the intensity of the sub-threshold current is strictly less than $10^{-7}$ A.

The behaviour of the device 1 is similar when it has a second threshold voltage $V_{th2}$ strictly greater than the first threshold voltage $V_{th1}$. In this case, the intensity of the current passing through it ($I_{Leak}$ or sub-threshold current) is very low as long as the voltage at the terminals of the device 1 is strictly less than $V_{th2}$. As soon as the threshold voltage $V_{th2}$ is reached, the current rapidly increases and the device 1 becomes very conductive. As soon as the voltage is reduced again below $V_{th2}$, the device 1 becomes a low conductor again. Here again, the intensity of the sub-threshold current is strictly less than $10^{-7}$ A.

The particularity of the materials chosen for the active layer 2 is to be able to provide a modulation of the threshold voltage $V_{th}$ according to the type of electrical programming pulse of the device 1. In other terms, the device 1 has at least two different voltage thresholds (a first threshold voltage $V_{th1}$ and a second threshold voltage $V_{th2}$) due to the material of the active layer that will react differently according to the shape of the electrical programming pulse, and in particular according to the descending flank of the electrical programming pulse. This operation will be explained in more details hereinafter.

It is understood that as soon as, contrary to resistive memories of the PCRAM or CBRAM type, the memory state does not depend on the resistivity of the device 1 but on the value of the threshold voltage, $V_{th1}$ or $V_{th2}$, which can be programmed and written in a non-volatile manner in the device 1. The device 1 according to the invention can thus be designated by the terminology "NVTS" or "non-volatile threshold switching" (device with a non-volatile switching threshold). The memory information is here given by the value of the threshold voltage.

Furthermore, having an intensity of sub-threshold current strictly less than $10^{-7}$ A and a volatile behaviour of the resistivity of the device 1 (i.e. according to whether the voltage is above or below the threshold voltage, the device respectively switches to the conductive or resistive state) makes it possible to have a device 1 that also acts as a selector; in a configuration of the crossbar type, in the absence of a polarisation voltage greater than the threshold voltage at the terminals of the device, the current passing through the device is very low and makes it possible to prevent a parasitic leakage current of the "sneak pass" type.

The device 1 is therefore both a non-volatile memory device (with the threshold voltage as memory information) and a selector (with a very low leakage current).

The programming and the reading of the device 1 according to the invention in reference to FIG. 6 shall be explained in what follows. FIG. 6 shows examples of programming voltage pulses (three pulses 100, 101 and 102) and of reading according to time that makes it possible to use the device 1 according to the invention as memory. Note that the programming and reading voltages can be inverted in polarity because the device according to the invention responds identically to a pulse with an inverted sign. Thus, when reference is made to a first voltage Vth1 with an intensity less than the intensity of the second threshold voltage Vth2, it must be understood that the absolute values of the two voltages are compared when the latter are negative.

The pulse 100 (referred to as RESET) is a programming pulse to bring the device 1 to the programming state represented by the second threshold voltage $V_{th2}$. This pulse has an intensity in voltage that is comprised between the first threshold voltage $V_{th1}$ and the second threshold voltage $V_{th2}$.

According to a first configuration, the device 1 is already in a programming state represented by the second threshold voltage $V_{th2}$. In this case, the device 1 will remain in this state. Indeed, in order for a change in the threshold voltage to occur, a sufficient programming current has to flow in the device 1. Here, in accordance with FIG. 5, with the value of the voltage remaining under the second threshold voltage $V_{th2}$, no switching can occur. This property makes it possible moreover to preserve the endurance of the device 1. However, according to a second configuration, if the device is in the programming state represented by the threshold voltage $V_{th1}$, as the programming voltage exceeds the threshold voltage $V_{th1}$, the device 1 switches to a conductive state and allows for the passing of a significant level of programming current. The duration of the descending flank of the pulse 100 is very short (close to 0). It is the combination of the presence of a significant programming current (i.e. conductive state of the device 1) and of the suitable choice of the substantially zero descending flank duration of the descent of the pulse for the specific material of the active layer 2 that makes it possible to modify the threshold voltage of the device 1 and have the latter change from $V_{th1}$ to $V_{th2}$ (thus the memory state $V_{th2}$ is written although the memory state $V_{th1}$ was written in the memory device 1).

The link between the descending duration of the programming pulse and the threshold voltage is shown in FIG. 7 which shows the behaviour of the threshold voltage $V_{th}$ (in Volts) according to the slope of the descending flank (in V/s) for three materials of the active layer Mat1, Mat2 and Mat3.

The active material Mat1 is a mixture of $As_2Te_3$ and $Ge_3Se_7$ alloys with 20% by weight of $As_2Te_3$.

The active material Mat2 is a mixture of $As_2Te_3$ and $Ge_3Se_7$ alloys with 40% by weight of $As_2Te_3$.

The active material Mat3 is a mixture of $As_2Te_3$ and $Ge_3Se_7$ alloys with 60% by weight of $As_2Te_3$.

The slope of the descending flank ("Ramp rate") is defined in FIG. 9. This is the ratio between the maximum amplitude of the programming voltage pulse and the duration of the descending flank. In other terms, for a given amplitude, the lower the duration of the descending flank is, the larger the slope is.

It is observed in FIG. 7 that for the material Mat1, the threshold voltage substantially increases with the slope of the descending flank. Thus, for the composition Mat1, there is a window of threshold voltages $V_{th}$ that is very substantial that ranges from a voltage threshold of about 2.25V (for a slope of about $0.5.10^7$ V/s, i.e. a substantial descending flank duration) to a threshold voltage of about 3.5V (for a slope of about $0.8.10^9$ V/s, i.e. a very short descending flank duration).

Thus, if the device is in the programming state represented by the threshold voltage $V_{th1}$ and a very short duration of the descending flank of the pulse 100 is used with a device 1 in a conductive state, the value of the threshold voltage will be modified thanks to the duration of the flank and will change the threshold voltage to the value $V_{th2}$ by choosing the suitable duration of the descending flank.

The pulse 101 (referred to as SET) is a programming pulse to bring the device 1 to the programming state represented by the first threshold voltage $V_{th1}$. This pulse has an intensity in voltage greater than the second threshold voltage $V_{th2}$ and a descending flank that has a duration greater than the duration of the descending flank of the pulse 100.

Here, contrary to the RESET programming, the effect of the pulse 101 is independent of the starting memory state. As the programming pulse 101 has a voltage intensity that exceeds the second threshold voltage $V_{th2}$ (and therefore a fortiori the threshold voltage $V_{th1}$), the device 1 will become conductive as soon as its threshold voltage is exceeded (whether it is $V_{th1}$ or $V_{th2}$). The current will therefore reach a level of current that is substantial enough. Then, the invention resides in the choice of the material of the active layer 2 so that the duration of the descending flank makes it possible to pass to the first threshold voltage $V_{th1}$. Here, the slope of the descending flank ("ramp rate") is advantageously comprised between $10^7$ V/s and $10^6$ V/s, which can result for example in a pulse of 3.5V for a descending flank duration comprised between 350 ns and 3.5 µs. By applying such a descending duration, the first threshold voltage $V_{th1}$ is "written" in the device 1.

It is observed in FIG. 7 that the material Mat1 has a maximum memory window with respect to the materials Mat2 and Mat3 (and therefore a maximum difference between the first threshold voltage $V_{th1}$ and the second threshold voltage $V_{th2}$). A percentage by weight of $As_2Te_3$ alloy of about 20% will therefore preferably be chosen. The material Mat2 with a percentage by weight of $As_2Te_3$ alloy of about 40% also offers this possibility with however a more reduced window. The material Mat3 with a percentage by weight of $As_2Te_3$ alloy of about 60% has on the other hand a window that is too reduced to allow for writing two different voltage thresholds in the same device according to the invention. Note that it is possible to choose the threshold voltages $V_{th1}$ and $V_{th2}$ at the two ends of the curve (Vthmin and Vthmax) but nothing prevents placing at another location of the curve: in this case, the duration of the slope of the descending flank will consequently be adapted (and reduced for the pulse 101 if a second threshold voltage $V_{th2}$ is considered that is lower than the maximum value of $V_{th2}$).

Advantageously, the alloys used for the active layer 2 do not have any crystallisation during the operation of the device 1 as NVTS.

This type of behaviour is linked to a reorganisation of the structure of the material that takes place during the application of a pulse with a sufficiently long descending flank, giving rise to a reduction in the threshold voltage of the device. It is to be underlined that even if a crystalline phase exists for $As_2Te_3$ and a crystalline phase for $Ge_3Se_7$, in the case of a mixture of the $As_2Te_3$ and $Ge_3Se_7$ alloys considered there is no corresponding crystalline phase. Only a phase segregation could give rise to the formation of a crystalline phase or phases (i.e. reached for example after an excessive rise in temperature, after excessive Resistive state/Conductive state cycling of the device, etc.). However, the behaviour of the NVTS type could be obtained through the preservation of an amorphous phase in the device in parallel with a partially or completely crystalline phase. This configuration is also compatible with the memory and selective functionalities of the device 1 object of the present invention.

Generally, the method for programming the device according to the invention comprises:
- a RESET step consisting of applying a voltage pulse comprised between $V_{th1}$ and $V_{th2}$ with a descending flank of a predetermined duration according to the material of the active layer of the device 1, to bring the device 1 to the programming state represented by the first threshold voltage $V_{th2}$;
- a SET step consisting of applying a voltage pulse greater than $V_{th2}$ with a predetermined descending flank of a predetermined non-zero duration according to the material of the active layer of the device 1 and greater than the duration of the descending flank of the RESET programming voltage pulse, to bring the device 1 to the programming state represented by the second threshold voltage $V_{th1}$.

FIG. 8 shows the behaviour of the sub-threshold current ("Leakage Current") according to the slope of the descending flank of the programming pulse for the three materials Mat1, Mat2 and Mat3 of the active layer 2 of the device 1. It is observed that this sub-threshold current remains at very low values much less than $10^{-7}$ A for the three materials Mat1, Mat2 and Mat3, regardless of the value of the slope of the descending flank of the programming pulse. This behaviour makes it possible to provide the selective function of the device 1.

The pulse 102 shown in FIG. 6 is a pulse that makes it possible to READ the memory state of the device 1. The READ pulse 102 is formed of a pulse with an intermediate voltage between the first threshold voltage $V_{th1}$ and the second threshold voltage $V_{th2}$. In the case of reading a programming state represented by the first threshold voltage $V_{th1}$, the device 1 will become conductive due to the exceeding of the threshold voltage $V_{th1}$, but the descending flank with a substantial duration of the pulse, substantially identical to that of a SET writing, will make it possible to reconstitute the programming state represented by the first initial threshold voltage $V_{th1}$ without the risk of writing the second programming state $V_{th2}$. Detecting a current passing through the device 1 indicates that the device 1 is in the memory state $V_{th1}$. Inversely, in the case of a reading of a programming state represented by the second threshold voltage $V_{th2}$, the device 1 will remain resistive (no switching) since the second threshold voltage $V_{th2}$ is not exceeded. Not detecting current in the device 1 indicates that the device is in the memory state $V_{th2}$. If the switching does not take place, the state $V_{th2}$ is read and maintained at the same time without any risk of disturbance (untimely writing for example).

Generally, the method for reading the memory state of the device according to the invention comprises a step of applying a voltage pulse strictly greater than $V_{th1}$ and strictly less than $V_{th2}$ with a predetermined descending flank of a predetermined non-zero duration and greater than the duration of the descending flank of the programming voltage pulse of the second memory state $V_{th2}$ (advantageously substantially identical to the duration of the descending flank of the programming voltage pulse of the first memory state $V_{th1}$, i.e. with a slope of the descending flank advantageously comprised between $10^7$ V/s and $10^6$ V/s).

In light of the effect of the slope of the programming pulse on the material of the active layer 2, intermediate programming state between $V_{th1}$ and $V_{th2}$ can be considered in order to obtain a multi-level programming of the MLC ("multi-level cell") type.

It should also be noted that the thickness of the active layer is advantageously chosen according to the difference desired between the first threshold voltage $V_{th1}$ and the second threshold voltage $V_{th2}$. This choice is in particular shown in FIG. 10 which shows the change in the threshold voltage for the material Mat2 according to the voltage threshold for four different thicknesses of the active layer 2: 10 nm, 15 nm, 25 nm and 50 nm. Thus, an increase in the thickness of the active layer advantageously increases the memory window, i.e. the possible difference between the two minimum and maximum threshold voltage. Such an increase goes against the current trend in PCRAMs which rather aims to reduce the thicknesses of the latter.

Although the invention was more specifically described in the case of a mixture of d'$As_2Te_3$ and of $Ge_3Se_7$ other alloys could be used, for example with a base of Si, Ge, As, Sb, Bi, S, Se, Te combined together but also with the introduction of elements (i.e. dopants) such as C, N or O. In particular the AsSe, AsTe, GeSe, GeS alloys with different stoichiometries are among those that could be combined in order to obtain the mechanism sought. Advantageously, the combination between an alloy of the IV-VI type (for example with a Ge and Se base) and an alloy of the VI-V type (for example with a As and Te base) can be used, the gap energy of the alloy of the IV-VI type being more substantial than that of the VI-V alloy. Note moreover that although the active layer 2 was described as a layer of material (mixture of $As_2Te_3$ and of $Ge_3Se_7$ alloys), a configuration of the active layer in the form of multi-layers of materials providing the memory behaviour and NVTS selector is also applicable to device according to the invention.

The deposition techniques of the different layers (electrodes, active layer) are well known to those skilled in the art. These can be techniques of the physical vapour deposition (PVD), chemical vapour deposition (CVD) or atomic layer deposition (ALD) type for example.

Of course, the programming proposed hereinabove is given solely for the purposes of illustration; an intelligent programming can be considered where the pulses can depend on the initial programming state of the device. This is the case for example when the device according to the invention has just been read and the state to be programmed corresponds to the state that has just been read: in this case, it is possible to overcome a programming pulse.

Likewise, any form of pulses that makes it possible to obtain the structural reorganisation of the material in the memory state $V_{th1}$, of course constitutes a possible alternative. In particular, the descending flank of the pulse can be further reduced by considering the portion of the same flank that has an effective impact on the change in the threshold voltage $V_{th}$. This type of pulse 200 is shown in FIG. 11. Contrary to the pulse 101 referred to as SET of FIG. 6, the pulse 200 is also a SET programming pulse to bring the device 1 to the programming state represented by the first threshold voltage $V_{th1}$. This pulse 200 has an intensity in voltage greater than the second threshold voltage $V_{th2}$ and a reduced descending flank 201 but the duration of which remains greater than the duration of the descending flank of the pulse 100 of FIG. 6. This remark is also valid for the reading pulse.

The global duration of each pulse of FIGS. 6 and 11 is chosen to guarantee the switching of the device if needed and the passing of a programming current for a sufficient duration in particular to reach the state $V_{th2}$. This global duration can for example be comprised between 10 ns and 300 ns for the mixture of $As_2Te_3$ and $Ge_3Se_7$ alloys. The programming current, which depends on the size (i.e. the surface) of the device according to the invention, is in the case of our illustration comprised between 1 mA and 2 mA. In an alternative, the device according to the invention can be cointegrated in series with a resistive memory, to give rise to a device that would make it possible to use the selective property of the device according to the invention to access (read and program) the resistive memory and have at the same time intrinsic memorisation properties.

The invention claimed is:

1. A selective non-volatile memory device comprising:
a first electrode;
a second electrode;
at least one layer made of an active material, forming an active memory layer, disposed between the first and the second electrode;
said selective non-volatile memory device having at least two programmable memory states:
a first programmable non-volatile memory state associated with a first threshold voltage $V_{th1}$ for the active memory layer, said selective non-volatile memory device having in said first memory state a characteristic voltage current such that said selective non-volatile memory device switches from a highly resistive state to a state that is less resistive than the highly resistive state as soon as a voltage greater than or equal to $V_{th1}$ is applied between the first and second electrodes and returns to its highly resistive state when the voltage applied is strictly less than $V_{th1}$, an intensity of the current passing through said selective non-volatile memory device in its highly resistive state being strictly less than $10^{-7}$ A;
a second non-volatile memory state associated with a second threshold voltage $V_{th2}$ strictly greater than the first threshold voltage $V_{th1}$, said selective non-volatile memory device having in said second memory state a characteristic voltage current such that said selective non-volatile memory device switches from a highly resistive state to a state that is less resistive than the highly resistive state as soon as a voltage greater than or equal to $V_{th2}$ is applied between the first and second electrodes and returns to its highly resistive state when the voltage applied is strictly less than $V_{th2}$, the intensity of the current passing through said selective non-volatile memory device in its highly resistive state being strictly less than $10^{-7}$ A;
the material of the active memory layer being made of a mixture of an $As_2Te_3$ alloy and of a $Ge_3Se_7$ alloy.

2. The selective non-volatile memory device according to claim 1, wherein the mixture comprises a percentage greater than 15% and strictly less than 60% by weight of the $As_2Te_3$ alloy.

3. The selective non-volatile memory device according to claim 2, wherein the mixture comprises a percentage substantially equal to 20% by weight of the $As_2Te_3$ alloy.

4. The selective non-volatile memory device according to claim 1, wherein a thickness of the active memory layer is chosen according to the difference desired between the first threshold voltage $V_{th1}$ and the second threshold voltage $V_{th2}$.

5. The selective non-volatile memory device according to claim 1, wherein the active memory layer is constituted by a single active layer made of a mixture of an $As_2Te_3$ alloy and of a $Ge_3Se_7$ alloy.

6. The selective non-volatile memory device according to claim 1, wherein the active memory layer is constituted by a stack of layers wherein each layer has a thickness less than or equal to 5 nm.

7. A method for writing the second memory state in a selective non-volatile memory device according to claim 1, comprising programming said second non-volatile memory state by applying a given programming current and a current pulse comprised between $V_{th1}$ and $V_{th2}$ with a descending flank of a predetermined duration.

8. A method for writing the first memory state in a selective non-volatile memory device according to claim 1, comprising programming 6 the first non-volatile memory state by applying a voltage pulse greater than $V_{th2}$ with a predetermined descending flank of a predetermined non-zero duration and greater than a duration of the descending flank of the programming voltage pulse of the second memory state.

9. The method according to claim 8, wherein the descending flank of a predetermined non-zero duration of the voltage pulse greater than $V_{th2}$ has a slope preferably comprised between $10^6$ V/s and $10^8$ V/s.

10. A method for reading the memory state of the selective non-volatile memory device according to claim 1, comprising applying a pulse with a voltage strictly greater than $V_{th1}$ and strictly less than $V_{th2}$ with a predetermined descending flank of a predetermined non-zero duration and greater than a duration of a descending flank of a programming voltage pulse of the second memory state.

\* \* \* \* \*